United States Patent
Lam et al.

(10) Patent No.: US 7,755,935 B2
(45) Date of Patent: Jul. 13, 2010

(54) BLOCK ERASE FOR PHASE CHANGE MEMORY

(75) Inventors: Chung Hon Lam, Peekskill, NY (US); Hsiang-Lan Lung, Elmsford, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 11/828,717

(22) Filed: Jul. 26, 2007

(65) Prior Publication Data
US 2009/0027950 A1     Jan. 29, 2009

(51) Int. Cl.
*G11C 11/00* (2006.01)
(52) U.S. Cl. .................. 365/163; 365/185.18
(58) Field of Classification Search .......... 365/163, 365/185.18, 185.24
See application file for complete search history.

(56) References Cited

U.S. PATENT DOCUMENTS

| | | | |
|---|---|---|---|
| 6,750,101 B2 | 6/2004 | Lung | |
| 7,068,534 B2 * | 6/2006 | Bedeschi et al. | 365/163 |
| 7,113,424 B2 * | 9/2006 | Happ et al. | 365/163 |
| 7,130,214 B2 * | 10/2006 | Lee | 365/163 |
| 7,149,110 B2 | 12/2006 | Tran et al. | |
| 2006/0056233 A1 | 3/2006 | Parkinson et al. | |
| 2006/0056251 A1 | 3/2006 | Parkinson | |
| 2006/0157682 A1 | 7/2006 | Scheuerlein | |
| 2006/0239073 A1 | 10/2006 | Toda | |

OTHER PUBLICATIONS

S. Lai et al., "OUM-A 180 nm Nonvolatile Memory Cell Element Technology For Stand Alone and Embedded Applications," IEDM 2001, pp. 36.5.1-36.5.4.

* cited by examiner

*Primary Examiner*—Son Dinh
(74) *Attorney, Agent, or Firm*—Ryan, Mason & Lewis, LLP

(57) ABSTRACT

An embodiment of our invention includes a method of programming at least one phase change memory block, the at least one block comprising at least one phase change memory cell, the at least one cell comprising at least one phase change material. The method includes the steps of transitioning all cells within the at least one block to a first state and, after all cells within the at least one block have been transitioned to the first state, transitioning at least one cell within the at least one block to at least a second state. Transitioning a cell to the at least second state is faster than transitioning a cell to the first state. At least the step of transitioning all cells within the at least one block to a first state may include transitioning all cells within the at least one block in a substantially simultaneous manner.

21 Claims, 3 Drawing Sheets

US 7,755,935 B2

BLOCK ERASE FOR PHASE CHANGE MEMORY

FIELD OF THE INVENTION

The present invention relates generally to memory devices, and more particularly relates to techniques for programming phase change memory devices.

BACKGROUND OF THE INVENTION

Non-volatile memory is an integral part of many electronic devices from mobile phones, digital cameras, and set-top boxes, to automotive engine controllers primarily because of its ability to store data even when power is turned off. Among the leading technologies for non-volatile memory are flash memory and phase change memory (PCM).

As is well known in the art, due to their inefficient per-byte alterablility, flash memory is typically erased in a block-by-block manner (block erase) prior to being programmed (e.g., storing data therein). This block erase typically comprises, for example, changing the polarity of a component through the use of Fowler-Nordheim tunneling. This typically entails the simultaneous application of a large negative voltage to a control gate and a positive voltage to a source, while leaving a drain floating.

Phase change memories, on the other hand, are typically programmed in a bitwise or bytewise fashion, which requires individually programming at least one cell by running a prescribed current through it. Not only is block erase not typically used in conjunction with the programming of PCMs, but many references, such as U.S. Patent Application Publication No. 2006/0056233, specifically recite that the ability to program PCMs without performing a block erase is an advantageous feature, as it allegedly renders the programming of PCMs more efficient than that of flash memory. Nonetheless, there may be instances when performing a block erase is desirable, as will be discussed herein.

Accordingly, there exists a need for techniques for programming a PCM that incorporate block erase functionality in an inventive fashion so as to provide for more efficient programming as compared to the prior art.

SUMMARY OF THE INVENTION

An embodiment of the present invention includes a method of programming at least one memory block, comprising at least one memory cell, within a memory array. The method includes the steps of transitioning all cells within the at least one block to a first state and, after all cells within the at least one block have been transitioned to the first state, transitioning one or more cells within the at least one block to at least a second state. Transitioning a cell to the at least second state is faster than transitioning a cell to the first state. At least the step of transitioning all cells within the at least one block to a first state may include transitioning all cells within the at least one block in a substantially simultaneous manner.

Another embodiment of the present invention includes a memory, comprising at least one block, a block comprising at least one cell, wherein at least one block is programmed by transitioning all cells within the at least one block to a first state and, after all cells within the at least one block have been transitioned to the first state, transitioning one or more cells within the at least one block to at least a second state. Transitioning a cell to the at least second state is faster than transitioning a cell to the first state. At least the step of transitioning all cells within the at least one block to a first state may include transitioning all cells within the at least one block in a substantially simultaneous manner.

Another embodiment of the present invention includes n integrated circuit comprising at least one phase change memory, the at least one memory comprising at least one phase change memory block, the at least one block comprising at least one phase change memory cell, the at least one cell comprising at least one phase change material, wherein the at least one block is programmed by performing the steps of transitioning all cells within the at least one block to a first state and, after all cells within the at least one block have been transitioned to the first state, transitioning one or more cells within the at least one block to at least a second state. Transitioning a cell to the at least second state is faster than transitioning a cell to the first state. At least the step of transitioning all cells within the at least one block to a first state may include transitioning all cells within the at least one block in a substantially simultaneous manner.

These and other objects, features and advantages of the present invention will become apparent from the following detailed description of illustrative embodiments thereof, which is to be read in connection with the accompanying drawing.

DETAILED DESCRIPTION OF THE INVENTION

Figure 1:
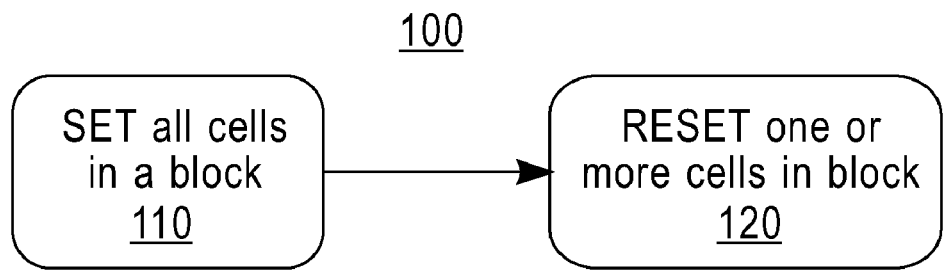
FIG. 1 is a simplified flow diagram of an exemplary method for programming a phase change memory block in accordance with inventive techniques.

This invention will be illustrated herein in conjunction with exemplary memory cells for use in, for example, integrated circuits. It should be understood, however, that the invention is not limited to the particular memory architecture, materials, features and processing steps shown and described herein. Modifications to the illustrative embodiments will become apparent to those skilled in the art.

Particularly with respect to processing steps, it is emphasized that the descriptions provided herein are not intended to encompass all of the processing steps which may be required to successfully form a functional integrated circuit device. Rather, certain processing steps which are conventionally used in forming integrated circuit devices, such as, for example, wet cleaning and annealing steps, are purposefully not described herein for economy of description. However one skilled in the art will readily recognize those processing steps omitted from these generalized descriptions.

One skilled in the art will also recognize that integrated circuits are typically formed in semiconductor wafers (i.e., substrates) that have two substantially flat surfaces before processing is initiated. The vertical direction is defined herein to be a direction perpendicular to these flat surfaces. In contrast, the horizontal or lateral direction is defined to be a direction parallel to these flat surfaces. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

What is more, the term "phase change material" (PCM) as used herein is intended to encompass any material displaying more than one programmable electrical resistance state for use in integrated circuits. It is recognized that this definition may encompass more materials than are customarily included within this term. PCMs as used herein comprise, for example, various chalcogenides and transition metal oxides and include, but are not limited to, doped or undoped GeSb, SbTe, $Ge_2Sb_2Te_5$ (GST), $SrTiO_3$, $BaTiO_3$, $(Sr,Ba)TiO_3$, $SrZrO_3$, $Ca_2Nb_2O_7$, $(Pr,Ca)MnO_3$, $Ta_2O_5$, NiOx and TiOx, as well as other suitable materials.

PCM cells are generally based on storage elements which utilize a class of materials, such as chalcogenides, that has the property of switching between two distinct states, the electrical resistance of which varies according to the crystallographic structure of the material. For example, a high-resistance, reset state may be obtained when an active region of the phase change (PC) material is in an amorphous or semi-amorphous phase, whereas a low-resistance, set state may be obtained when the PC material is in a crystalline, polycrystalline or semi-crystalline phase. The recited association of reset and set with substantially amorphous and substantially crystalline states, respectively, is a convention; other conventions may be adopted.

Although the description herein discusses only two states, it is to be understood that a phase change memory cell is capable of multilevel operation, wherein it may assume a greater number of discrete states, or even operate in a continuous fashion. For example, a phase change material memory element may be in varying degrees of amorphous or semi-amorphous phases representing multiple levels for multiple-bit storage. The inventive techniques disclosed herein may be used with such multilevel phase change memory cells.

FIG. 1 is a simplified flow diagram of an exemplary method 100 for programming a phase change memory block in accordance with inventive techniques. In step 110, all memory cells within a given block are set in a substantially simultaneous manner. Setting a phase change memory cell comprises heating a volume of phase change memory material to a relatively lower crystallization temperature (e.g., by an electrical current via Joule heating) and allowing it to anneal at a slower rate in order to crystallize the memory material. Techniques for performing this action in a substantially simultaneous fashion will be discussed hereinafter with reference to FIG. 2. In step 120, one or more memory cells within the block may be reset in, for example, an individual (e.g., bitwise) or group-based (e.g., bytewise, wordwise, or even blockwise) manner. Resetting a phase change memory cell comprises heating a volume of phase change memory material to a relatively higher temperature and then subsequently cooling at a fast rate to amorphisize the memory material.

Because of the slower cooling required, a set operation takes considerably more time than a reset operation in a PCM cell. Typically, for example, a reset operation may take nanoseconds, whereas a set operation may take microseconds, due to the aforementioned differential in relative heating and cooling times. Because of this differential, it is more efficient to perform the longer set operation on all cells and then perform reset operations on one or more cells as needed. By doing so, one can exploit the especially high speeds associated with a reset operation and thereby dramatically speed up the entire memory write process.

Figure 2:
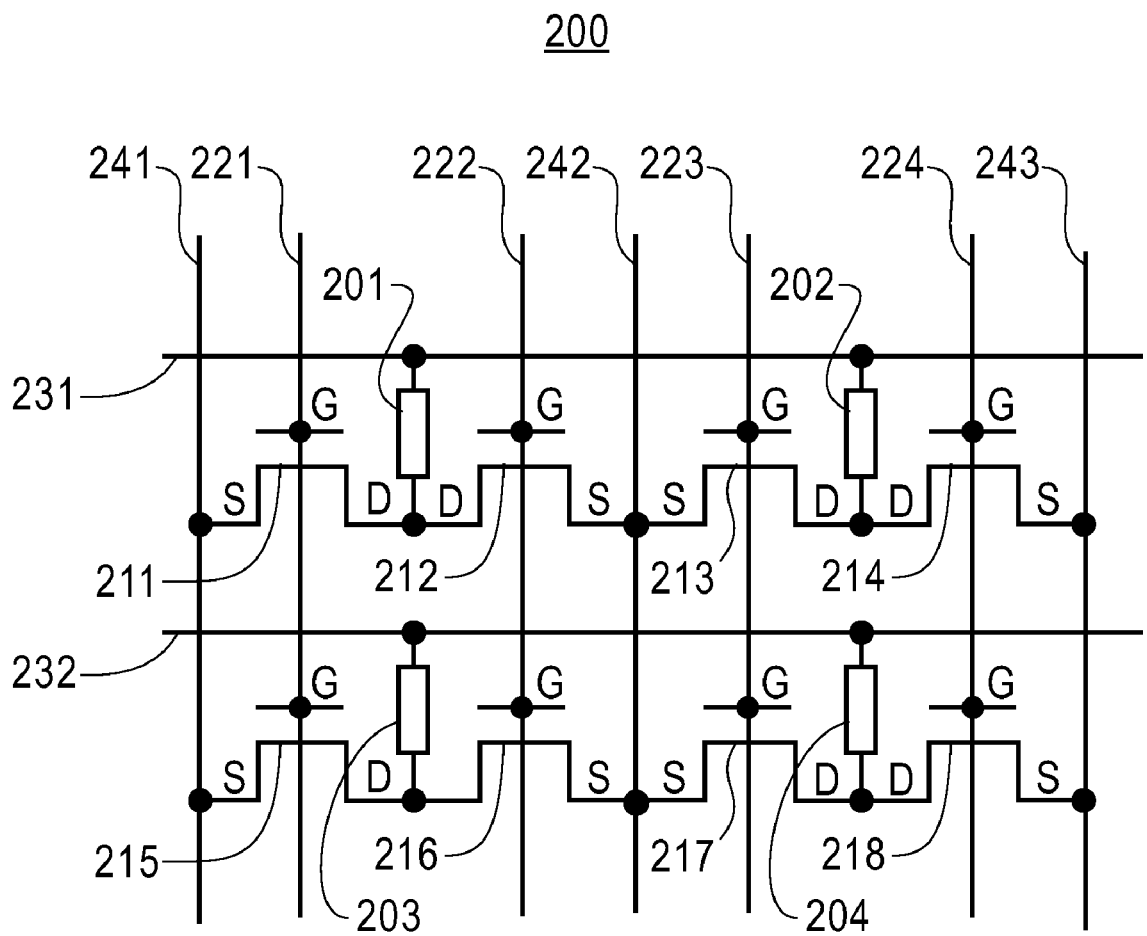
FIG. 2 is a simplified diagram of an exemplary phase change memory block in which inventive techniques may be implemented.

FIG. 2 is a simplified diagram of an exemplary phase change memory block 200 in which inventive techniques may be implemented. This exemplary block 200, which may be a component of a phase change memory (such as one found on an integrated circuit), comprises four phase change memory cells 201, 202, 203, 204. Memory block 200 further comprises a plurality of transistors, such as n-channel metal-oxide-semiconductor (NMOS) devices 211, 212, 213, 214, 215, 216, 217 and 218, which, in conjunction with word lines 221, 222, 223 and 224, bit lines 231 and 232, and source lines 241, 242 and 243, provide the ability to selectively access one or more of the memory cells.

Specifically, sources (S) of devices 211 and 215 are connected to source line 241, sources of devices 212, 213, 216 and 217 are connected to source line 242, and sources of devices 214 and 218 are connected to source line 243. Gates (G) of devices 211 and 215 are connected to word line 221, gates of devices 212 and 216 are connected to word line 222, gates of devices 213 and 217 are connected to word line 223, and gates of devices 214 and 218 are connected to word line 224. A first terminal of PCM cells 201 and 202 are connected to bit line 231, a second terminal of cell 201 is connected to drains (D) of devices 211 and 212, a second terminal of cell 202 is connected to drains of devices 213 and 214, a first terminal of PCM cells 203 and 204 are connected to bit line 232, a second terminal of cell 203 is connected to drains of devices 215 and 216, and a second terminal of cell 204 is connected to drains of devices 217 and 218. The configuration shown here is strictly exemplary and inventive techniques may be applied with blocks comprising any number of phase change memory cells in essentially any desired configuration.

Each of PCM cells 201, 202, 203, 204 comprises at least one phase change material. As indicated above, this phase change material may include, for example, a chalcogenide and/or a transition metal oxide. Furthermore, as discussed above, each phase change memory cell is capable of being in one of at least two states at any given time. Each of PCM cells 201, 202, 203, 204 is connected to one or more of word lines 221, 222, 223, 224; bit lines 231, 232; and source lines 241, 242, 243, as described above.

In an illustrative embodiment, source lines 241, 242, 243 may be connected to ground (e.g., zero volt) or another source of voltage. The PCM cells 201, 202, 203, 204 may be selectively accessed by the bit lines 231, 232 and word lines 221, 222, 223, 224. For example, a method of transitioning a source line from one state to another may comprise sending a current pulse through one or more word lines and/or bit lines.

For example, a step (e.g., step 110 of method 100) of simultaneously setting all cells within block 200 may comprise applying a voltage at least equal to a set threshold voltage of PCM cells 201, 202, 203, 204 to all word lines 221, 222, 223, 224 and applying a voltage at least equal to a set threshold voltage to all bit lines 231, 232. Once all cells have been simultaneously set, one or more of the cells within block 200 may be reset (e.g., step 120 of method 100) by applying a voltage at least equal to a reset threshold voltage of one or more of PCM cells 201, 202, 203, 204 to one or more of word lines 221, 222, 223, 224 and applying a voltage at least equal to a reset threshold voltage to one or more of bit lines 231, 232.

Figure 3:
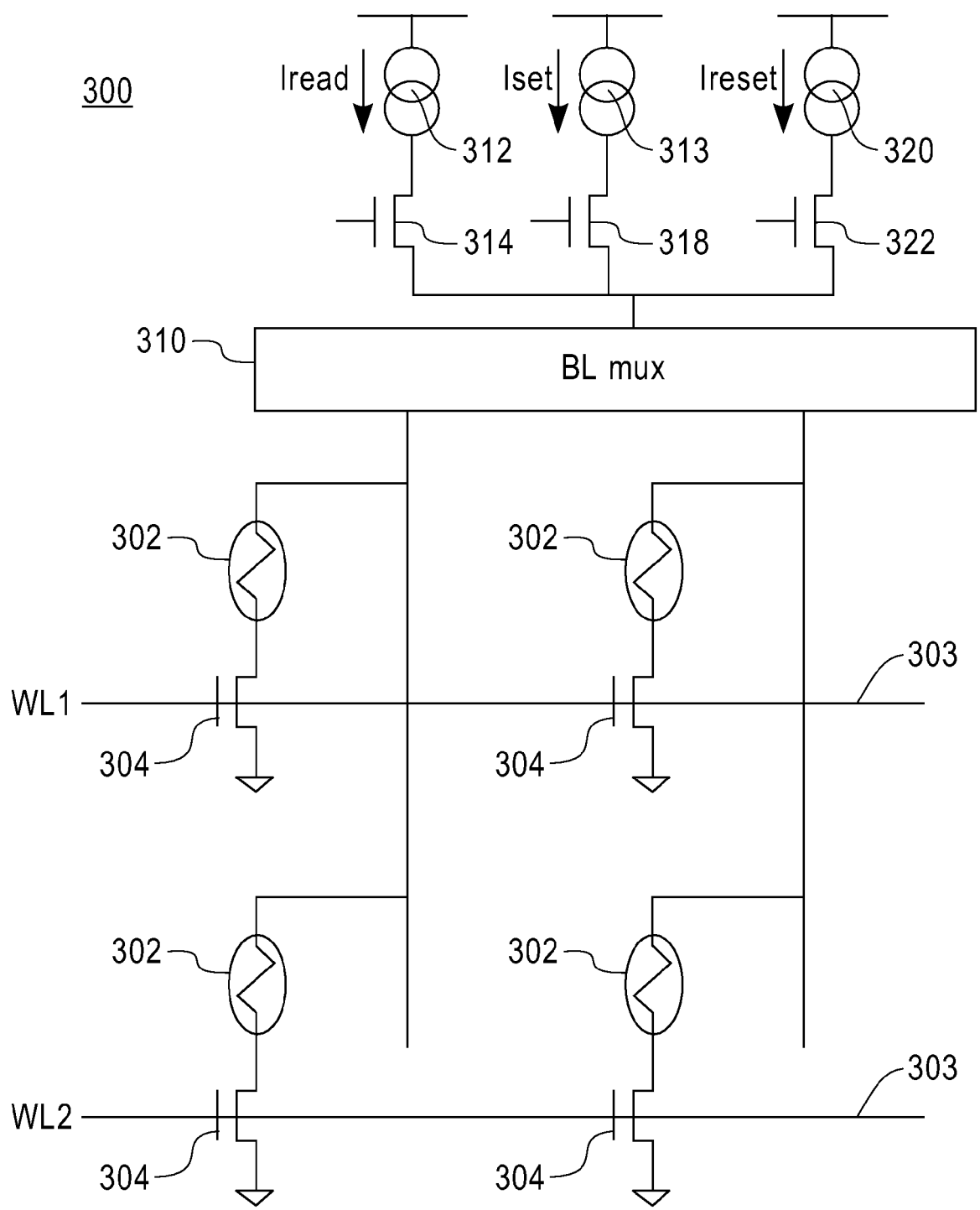
FIG. 3 is a schematic diagram illustrating an exemplary phase change memory circuit in which inventive techniques may be implemented.

FIG. 3 is a schematic diagram illustrating an exemplary phase change memory circuit 300 in which the programming techniques of the present invention can be employed, in accordance with another aspect of the present invention. The memory circuit 300 preferably comprises a plurality of PCM cells 302 and corresponding access transistors 304 connected thereto. The access transistors 304 are selectively activated by application of appropriate signals, WL1, WL2, to corresponding word lines 606 in the memory circuit 300. Each of the access transistors 304 is preferably operative to connect a first electrode of the corresponding PCM cell 302 to ground, or an alternative voltage source. In an alternative embodiment, diodes or other switching elements may be used as select devices instead of transistors.

Memory circuit 300 further includes a plurality of current sources 312, 316 and 320, supplying currents Iread, Iset and Ireset, respectively, to the PCM cells 302 via a bit line multiplexer (BL mux) 310, or an alternative switching arrangement. Each of the current sources 312, 316, 320 is preferably connected to the multiplexer 310 through a corresponding switch, 314, 318 and 322, respectively, which may comprise a transistor as shown. The current Iread is preferably configured for selectively reading a logical state of the PCM cells 302, while the currents Iset and Ireset are preferably configured for performing a set and reset operation, respectively, for selectively writing a logical state of the cells.

Figure 4:
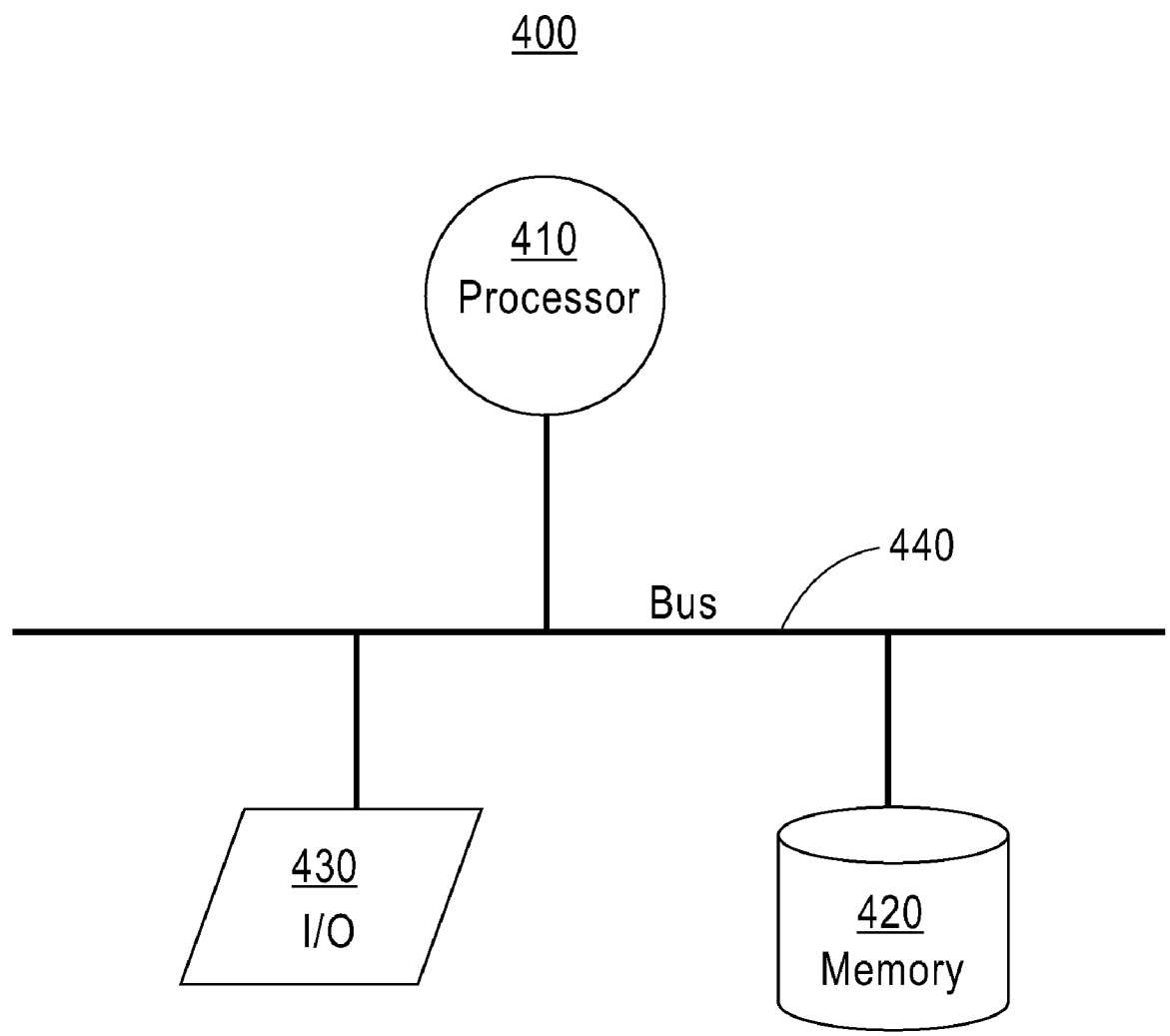
FIG. 4 is a block diagram depicting an exemplary processing system in which inventive techniques may be implemented.

The methodologies of embodiments of the invention may be particularly well-suited for use in an electronic device or alternative system. For example, FIG. 4 is a block diagram depicting an exemplary processing system 400 formed in accordance with an aspect of the invention. System 400 may include a processor 44, memory 420 coupled to the processor (e.g., via a bus 430 or alternative connection means), as well as input/output (I/O) circuitry 440 operative to interface with the processor. The processor 410 may be configured to perform at least a portion of the methodologies of the present invention, illustrative embodiments of which are shown in the above figures and described therein.

It is to be appreciated that the term "processor" as used herein is intended to include any processing device, such as, for example, one that includes a central processing unit (CPU) and/or other processing circuitry (e.g., digital signal processor (DSP), microprocessor, etc.). Additionally, it is to be understood that the term "processor" may refer to more than one processing device, and that various elements associated with a processing device may be shared by other processing devices. The term "memory" as used herein is intended to include memory and other computer-readable media associated with a processor or CPU, such as, for example, random access memory (RAM), read only memory (ROM), fixed storage media (e.g., a hard drive), removable storage media (e.g., a diskette), flash memory, etc. Furthermore, the term "I/O circuitry" as used herein is intended to include, for example, one or more input devices (e.g., keyboard, mouse, etc.) for entering data to the processor, and/or one or more output devices (e.g., printer, monitor, etc.) for presenting the results associated with the processor.

Accordingly, an application program, or software components thereof, including instructions or code for performing the methodologies of the invention, as described herein, may be stored in one or more of the associated storage media (e.g., ROM, fixed or removable storage) and, when ready to be utilized, loaded in whole or in part (e.g., into RAM) and executed by the processor 410. In any case, it is to be appreciated that at least a portion of the components shown in the above figures may be implemented in various forms of hardware, software, or combinations thereof e.g., one or more DSPs with associated memory, application-specific integrated circuit(s), functional circuitry, one or more operatively programmed general purpose digital computers with associated memory, etc. Given the teachings of the invention provided herein, one of ordinary skill in the art will be able to contemplate other implementations of the components of the invention.

At least a portion of the methodologies of the present invention may be implemented in an integrated circuit. In forming integrated circuits, a plurality of identical die is typically fabricated in a repeated pattern on a surface of a semiconductor wafer. At least one die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A method of programming at least one phase change memory block comprising at least one phase change memory cell, the method comprising the steps of:
   transitioning all cells within the at least one block to a first state;
   after all cells within the at least one block have been transitioned to the first state, transitioning one or more cells within the at least one block to at least a second state;
   wherein transitioning a cell to the at least second state is faster than transitioning a cell to the first state.

2. The method of claim 1, wherein at least the step of transitioning all cells within the at least one block to a first state comprises transitioning all cells within the at least one block in a substantially simultaneous manner.

3. The method of claim 2, wherein the step of transitioning all cells of the at least one block in a substantially simultaneous manner comprises the steps of:
   applying a voltage at least equal to a threshold voltage of a cell to all word lines within the at least one block; and
   applying the voltage at least equal to the threshold voltage to all bit lines within the at least one block.

4. The method of claim 1, wherein the first state is a set state and the at least second state is a reset state.

5. The method of claim 1, wherein in the first state, the memory cell is a first resistance and in the at least second state, the memory cell is at least a second resistance, the first resistance being greater than the at least second resistance.

6. The method of claim 1, wherein the first state is indicative of the at least one phase change material being in a crystalline, polycrystalline or semi-crystalline phase and the at least second state is indicative of the at least one phase change material being in at least one amorphous or semi-amorphous phase.

7. The method of claim 6, wherein the at least second state comprise a plurality of degrees of amorphous or semi-amorphous phases representing a plurality of levels for storage of a plurality of bits.

8. A phase change memory circuit comprising:
   at least one phase change memory block comprising at least one phase change memory cell; and
   a controller operative to program the at least one block by performing the steps of:
   transitioning all cells within the at least one block to a first state;
   after all cells within the at least one block have been transitioned to the first state, transitioning at least one cell of the at least one block to at least a second state;
   wherein transitioning a given cell to the at least second state is faster than transitioning the given cell to the first state.

9. The memory of claim 8, wherein at least the step of transitioning all cells within the at least one block to a first state comprises transitioning all cells within the at least one block in a substantially simultaneous manner.

10. The memory of claim 9, wherein the step of transitioning all cells of the at least one block in a substantially simultaneous manner comprises the steps of:
applying a voltage at least equal to a threshold voltage of a cell to all word lines within the at least one block; and
applying the voltage at least equal to the threshold voltage to all bit lines within the at least one block.

11. The memory of claim 8, wherein the first state is a set state and the at least second state is a reset state.

12. The memory of claim 8, wherein in the first state, the memory cell is a first resistance and in the at least second state, the memory cell is at least a second resistance, the first resistance being greater than the at least second resistance.

13. The memory of claim 8, wherein the first state is indicative of the at least one phase change material being in a crystalline, polycrystalline or semi-crystalline phase and the at least second state is indicative of the at least one phase change material being in at least one amorphous or semi-amorphous phase.

14. The memory of claim 13, wherein the at least second state comprises a plurality of degrees of amorphous or semi-amorphous phases representing a plurality of levels for storage of a plurality of bits.

15. An apparatus comprising:
at least one phase change memory comprising at least one phase change memory block comprising at least one phase change memory cell; and
a processor, coupled to the at least one memory and operative to perform the steps of:
transitioning all cells within the at least one block to a first state;
after all cells within the at least one block have been transitioned to the first state, transitioning all cells of the at least one block to at least a second state;
wherein transitioning a cell to the at least second state is faster than transitioning a cell to the first state.

16. The apparatus of claim 15, wherein at least the step of transitioning all cells within the at least one block to a first state comprises transitioning all cells within the at least one block in a substantially simultaneous manner.

17. The apparatus of claim 15, wherein the step of transitioning all cells of the at least one block in a substantially simultaneous manner comprises the steps of:
applying a voltage at least equal to a threshold voltage of a cell to all word lines within the at least one block; and
applying the voltage at least equal to a threshold voltage to all bit lines within the at least one block.

18. The apparatus of claim 15, wherein the first state is a set state and the at least second state is a reset state.

19. The apparatus of claim 15, wherein in the first state, the memory cell is a first resistance and in the at least second state, the memory cell is at least a second resistance, the first resistance being greater than the at least second resistance.

20. The apparatus of claim 15, wherein the first state is indicative of the at least one phase change material being in a crystalline, polycrystalline or semi-crystalline phase and the at least second state is indicative of the at least one phase change material being in at least one amorphous or semi-amorphous phase.

21. The apparatus of claim 15, wherein the at least second state comprises a plurality of degrees of amorphous or semi-amorphous phases representing a plurality of levels for storage of a plurality of bits.

\* \* \* \* \*